US007163408B1

(12) United States Patent
Chen et al.

(10) Patent No.: US 7,163,408 B1
(45) Date of Patent: Jan. 16, 2007

(54) ELECTRICAL CONNECTOR

(75) Inventors: Shi-Jung Chen, Chung Ho (TW); Chun-Hsu Chen, Chung Ho (TW)

(73) Assignee: Jess-Link Products Co., Ltd., Taipei County (TW)

( * ) Notice: Subject to any disclaimer, the term of this patent is extended or adjusted under 35 U.S.C. 154(b) by 0 days.

(21) Appl. No.: 11/274,124

(22) Filed: Nov. 16, 2005

(51) Int. Cl.
*H01R 12/00* (2006.01)
*H05K 1/00* (2006.01)

(52) U.S. Cl. ...................................... 439/76.1; 439/455

(58) Field of Classification Search ................ 439/731, 439/455, 493, 76.1, 610
See application file for complete search history.

(56) References Cited

U.S. PATENT DOCUMENTS 5,797,771 A * 8/1998 Garside ...................... 439/610
5,810,620 A * 9/1998 Kobayashi et al. ......... 439/610

* cited by examiner

*Primary Examiner*—Javaid H. Nasri
(74) *Attorney, Agent, or Firm*—Rosenberg, Klein & Lee

(57) ABSTRACT

A connector has a first outer casing, a second outer casing, and a cable module. The first outer casing has a first front sectional portion. The second outer casing has a second front sectional portion. The cable module includes a printed circuit board, a cable, and an insulating member. The printed circuit board has a plurality of electric pads disposed at a front thereof. The cable has a front electrically connected to a rear of the printed circuit board. The insulating member retains the front of the cable and the rear of the printed circuit board. The printed circuit board is received between the first front sectional portion and the second front sectional portion. The front of the printed circuit board extends out of the first front sectional portion and the second front sectional portion. As such, the number of components of the connector of the present invention is reduced.

19 Claims, 6 Drawing Sheets

ELECTRICAL CONNECTOR

BACKGROUND OF THE INVENTION

1. Field of the Invention

The present invention relates to a connector, and more particularly, to an electric connector.

2. Background of the Invention

Electric connectors include many types and are commonly used with various electronic products. For example, high-frequency connectors are indispensable components for communication products.

Referring to FIG. 1 and FIG. 2, a conventional connector provided by Tyco Electronics includes a first outer casing 91, a second outer casing (not shown), a cable module 93, an inner insulating casing 94, a plurality of fasteners (not shown), and an inner metal casing 96. The cable module 93 includes a printed circuit board (not shown) and a cable 931. The cable 931 is electrically connected to the printed circuit board. The printed circuit board is fixed in the inner insulating casing 94. The inner insulating casing 94 is fixed in the inner metal casing 96. The inner metal casing 96 has a rear fixed between a front of the first outer casing 91 and a front of the second outer casing. The fasteners penetrate through the second outer casing and fasten the first outer casing 91.

The printed circuit board of the cable module 93 and the inner insulating casing 94 have to be disposed in the inner metal casing 96, and the rear of the inner metal casing 96 is then fixed between the front of the first outer casing 91 and the front of the second outer casing. As a result, the connector has many components, and the production cost thereof is therefore increased.

Additionally, the cable 931 is not stably retained between the first outer casing 91 and the second outer casing. Once the cable 931 is pulled, the printed circuit board will become loose and its position will be altered.

SUMMARY OF THE INVENTION

The primary object of the invention is therefore to specify a connector with a reduced number of components thereof, thereby reducing the production costs thereof.

Another object of the invention is therefore to specify a connector that improves the stability of a cable thereof.

According to the invention, the objects are achieved via a connector comprising a first outer casing, a second outer casing, and a cable module. The first outer casing has a first body portion and a first front sectional portion, and the first front sectional portion extends forwardly from a front end of the first body portion. The second outer casing has a second body portion and a second front sectional portion, and the second front sectional portion extends forwardly from a front end of the second body portion. The cable module includes a printed circuit board, a cable, and an insulating member. The printed circuit board has a plurality of electric pads disposed at a front thereof. The cable has a front electrically connected to a rear of the printed circuit board. The insulating member retains the front of the cable and the rear of the printed circuit board. The insulating member is received between the first body portion and the second body portion. The printed circuit board is received between the first front sectional portion and the second front sectional portion. The front of the printed circuit board extends out of the first front sectional portion and the second front sectional portion.

As the first outer casing and the second outer casing form a first front sectional portion and a second front sectional portion, respectively, to receive the printed circuit board therein, the number of components of the connector of the present invention is reduced, and production costs thereof are reduced.

In a preferable embodiment, the first body portion of the first outer casing has a first locking recess disposed in an inner surface thereof. The second body portion of the second outer casing has a second locking recess disposed in an inner surface thereof. The cable has a locking block. The locking block is positioned in the first locking recess and the second locking recess.

As the locking block is positioned in the first locking recess and the second locking recess, the stability of the cable is improved.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention which will be described hereinafter and which will form the subject of the claims appended hereto.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE EMBODIMENTS

Figure 1:
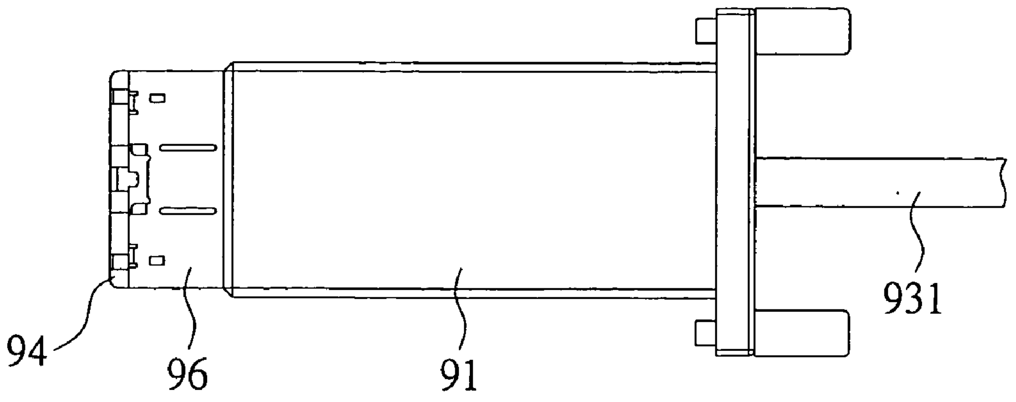
FIG. 1 PRIOR ART
FIG. 1 is an assembled planar view of a connector of the prior art.
Figure 2:
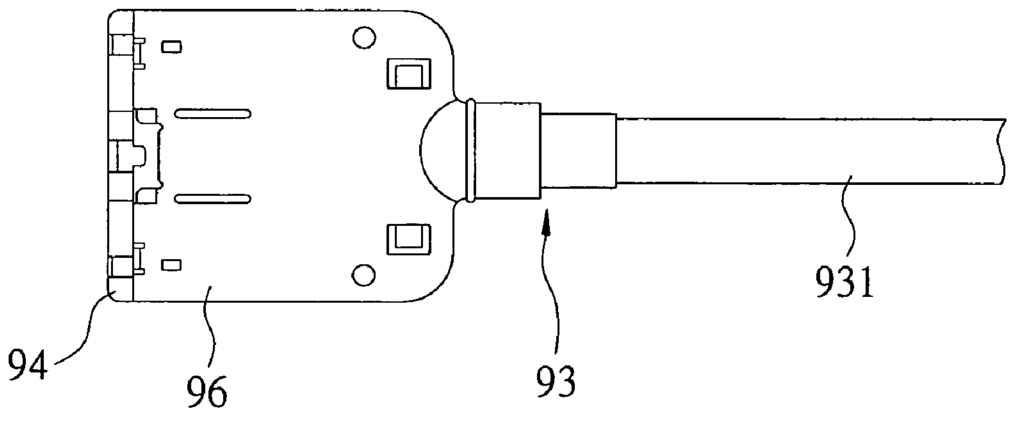
FIG. 2 PRIOR ART
FIG. 2 is an assembled planar view of a cable module and an inner metal casing of a connector of the prior art.
Figure 3:
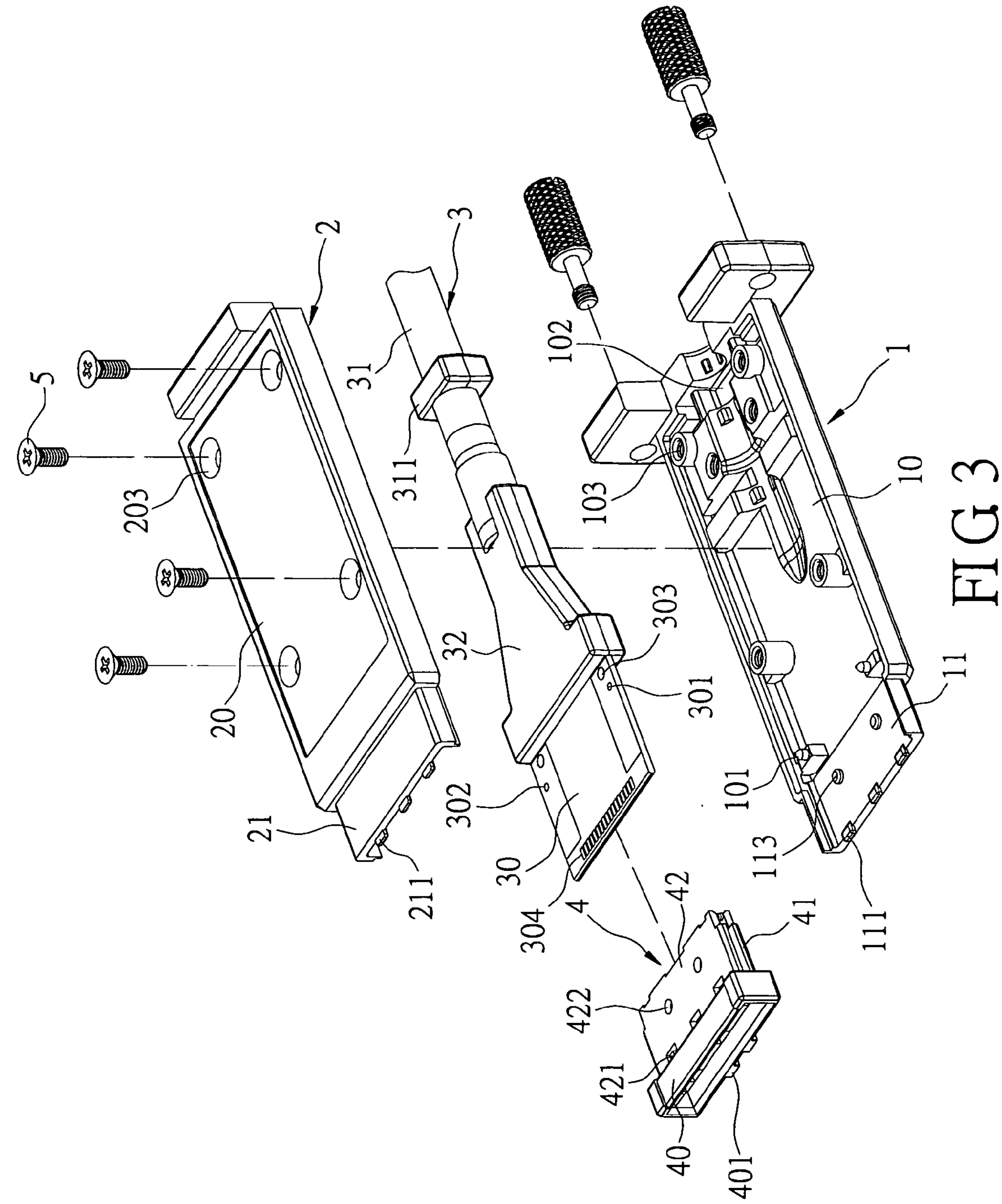
FIG. 3 is an exploded perspective view of a connector of the present invention.
Figure 4:
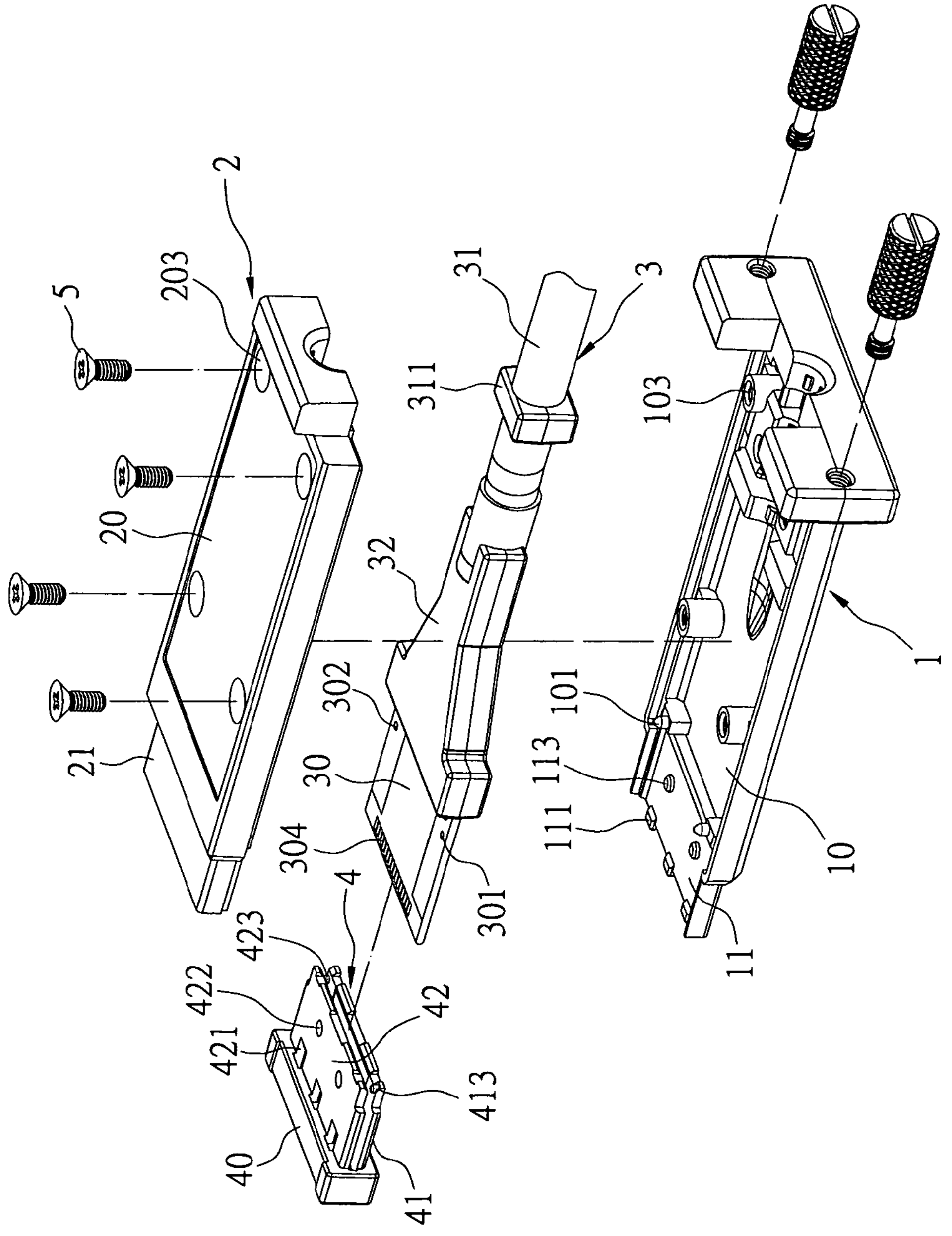
FIG. 4 is another exploded perspective view of a connector of the present invention.
Figure 5:
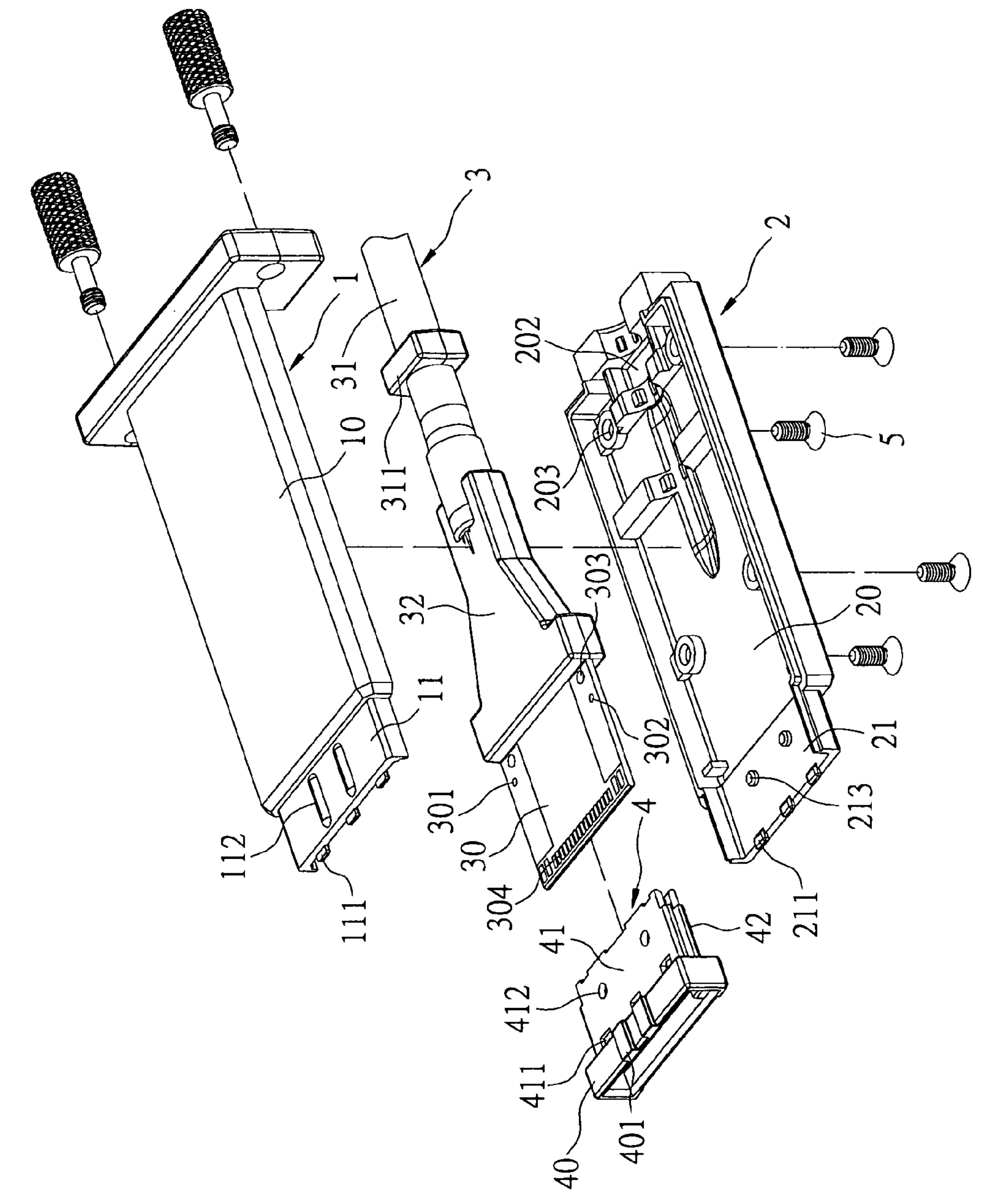
FIG. 5 is still another exploded perspective view of a connector of the present invention.
Figure 6:
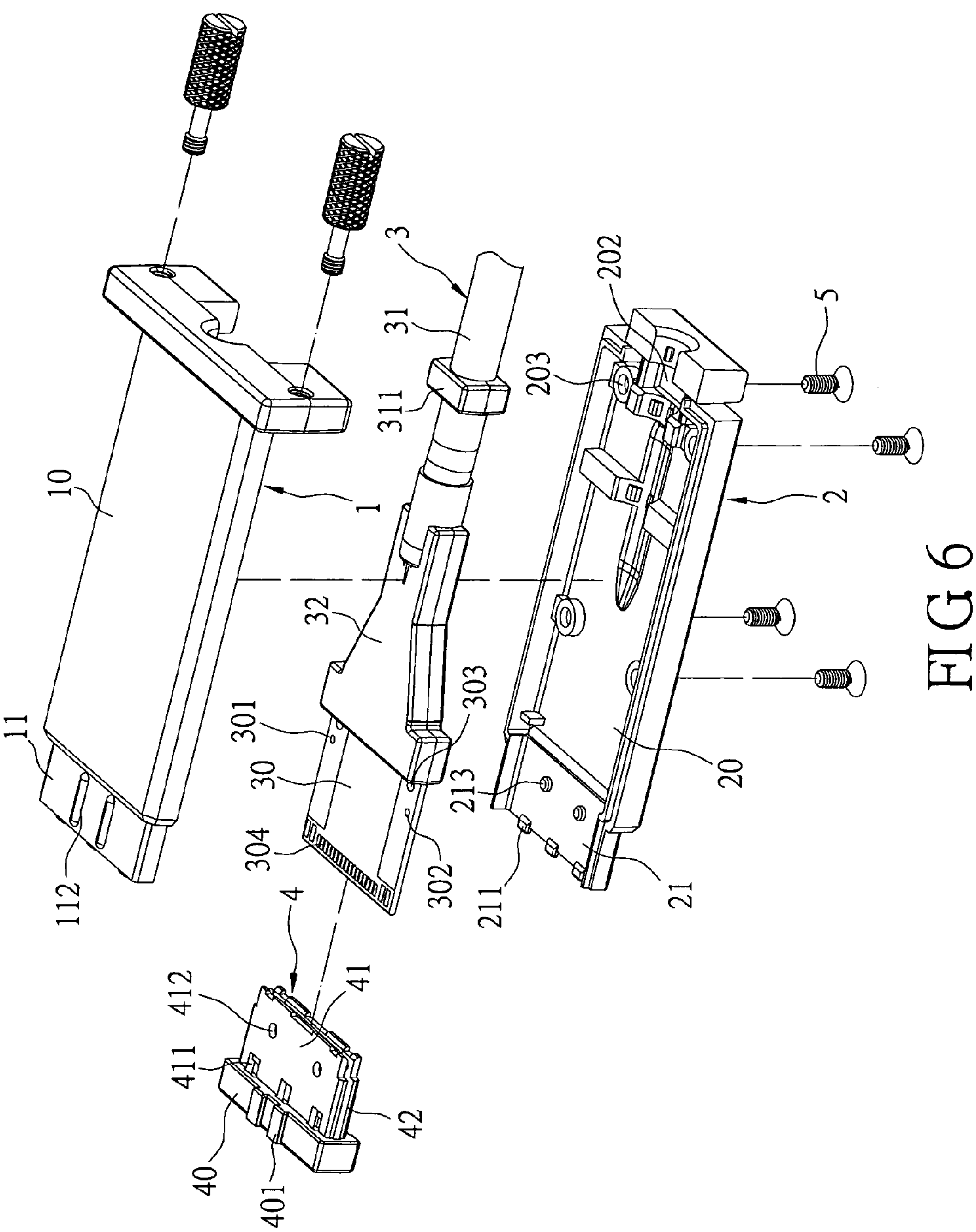
FIG. 6 is still another exploded perspective view of a connector of the present invention.
Figure 7:
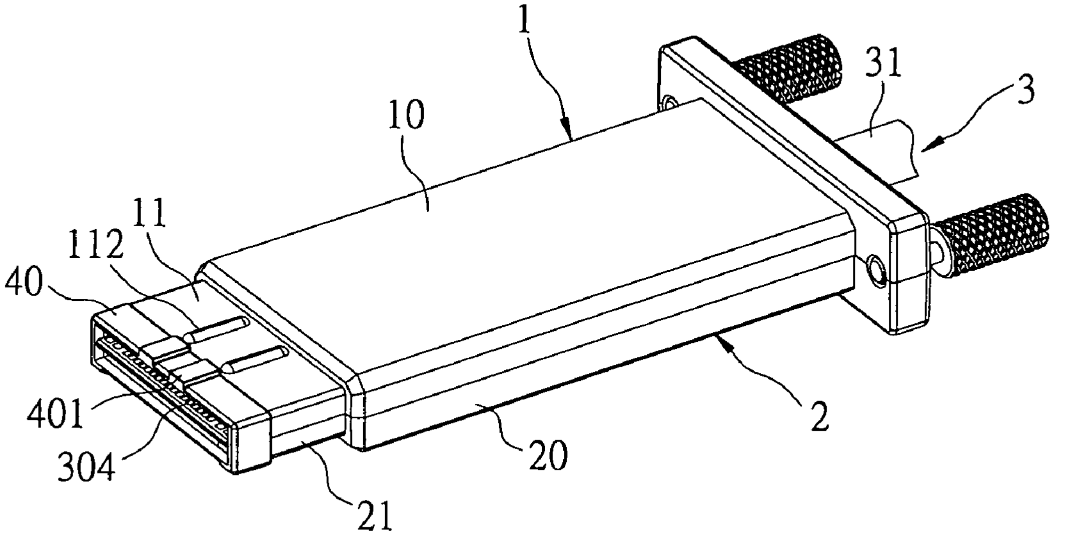
FIG. 7 is an assembled perspective view of a connector of the present invention.

Referring to FIGS. 3–7, the present invention provides a connector comprising a first outer casing 1, a second outer casing 2, a cable module 3, an inner insulating casing 4, and a plurality of fasteners 5 (such as screws).

The first outer casing 1 has a first body portion 10 and a first front sectional portion 11. The first front sectional portion 11 extends forwardly from a front end of the first body portion 10. The first body portion 10 has a positioning post 101 disposed on a front of an inner surface thereof. The first body portion 10 has a first locking recess 102 disposed in a rear of the inner surface thereof. The first body portion 10 further has a plurality of first fastening holes 103. The first front sectional portion 11 has a first insertion tab 111 disposed on a front edge thereof. The first front sectional portion 11 has a guiding protrusion 112 disposed on an outer surface thereof. The first front sectional portion 11 has a first projection 113 disposed on an inner surface thereof.

The second outer casing 2 has a second body portion 20 and a second front sectional portion 21. The second front sectional portion 21 extends forwardly from a front end of the second body portion 20. The second body portion 20 has a second locking recess 202 disposed in a rear of an inner surface thereof. The second body portion 20 further has a plurality of second fastening holes 203. The second front sectional portion 21 has a second insertion tab 211 disposed on a front edge thereof. The second front sectional portion 21 has a second projection 213 disposed on an inner surface thereof.

The cable module 3 includes a printed circuit board 30, a cable 31, and an insulating member 32. The printed circuit board 30 has a plurality of electric pads 304 disposed at a front thereof for electrically contacting electric points of a mating connector. The printed circuit board 30 further has a first through hole 301, a second through hole 302, and a positioning hole 303. The first through hole 301 and the second through hole 302 are asymmetrically arranged, so that the printed circuit board 30 can be assembled to the inner insulating casing 4 correctly. The cable 31 has a front electrically connected to a rear of the printed circuit board 30, and the insulating member 32 retains the front of the cable 31 and the rear of the printed circuit board 30. In this embodiment, the cable 31 includes an outer insulating layer (not labeled) and a plurality of conducting wires (not shown). The conducting wires define a front portion extending out of a front of the outer insulating layer for electrically connecting to the printed circuit board 30. The insulating member 32 also retains the front portion of the conducting wires to improve the stability of the conducting wires. In addition, the outer insulating layer of the cable 31 has a locking block 311.

The inner insulating casing 4 has a front frame portion 40, a first clipping portion 41, and a second clipping portion 42. A front end of the first clipping portion 41 and a front end of the second clipping portion 42 are connected to the front frame portion 40. The inner insulating casing 4 has a first insertion hole 411 and a second insertion hole 421. The first insertion hole 411 is disposed between the first clipping portion 41 and the front frame portion 40, the second insertion hole 421 is disposed between the second clipping portion 42 and the front frame portion 40, and the first insertion hole 411 and the second insertion hole 421 are asymmetrically arranged, so that the inner insulating casing 4 can be assembled to the first outer casing 1 and the second outer casing 2 correctly. The front frame portion 40 of the inner insulating casing 4 has a guiding protrusion 401. The first clipping portion 41 has a first aperture 412, the second clipping portion 42 has a second aperture 422, and the first aperture 412 and the second aperture 422 are asymmetrically arranged, so that the inner insulating casing 4 can be assembled to the printed circuit board 30. In addition, the first clipping portion 41 has a first protruding post 413 disposed on an inner surface thereof, and the second clipping portion 42 has a second protruding post 423 disposed on an inner surface thereof.

In assembly, the printed circuit board 30 is firstly inserted into the inner insulating casing 4. The first protruding post 413 of the first clipping portion 41 and the second protruding post 423 of the second clipping portion 42 are respectively penetrated through the first through hole 301 and the second through hole 302 of the printed circuit board 30. As such, the printed circuit board 30 is fixed between the first clipping portion 41 and the second clipping portion 42, and the front of the printed circuit board 30 is located in the front frame portion 40.

Next, the first insertion tab 111 of the first outer casing 1 is positioned in the first insertion hole 411 of the inner insulating casing 4. The first projection 113 of the first front sectional portion 11 is positioned in the first aperture 412 of the first clipping portion 41. The positioning post 101 of the first outer casing 1 penetrates through the positioning hole 303 of the printed circuit board 30. The locking block 311 of the cable 31 is positioned in the first locking recess 102 of the first body portion 10.

Next, the second insertion tab 211 of the second outer casing 2 is positioned in the second insertion hole 421 of the inner insulating casing 4. The second projection 213 of the second front sectional portion 21 is positioned in the second aperture 422 of the second clipping portion 42. The locking block 311 of the cable 31 is positioned in the second locking recess 202 of the second body portion 20.

In this way, the insulating member 32 is received between the first body portion 10 and the second body portion 20. The first clipping portion 41, the second clipping portion 42, and the printed circuit board 30 are received between the first front sectional portion 11 and the second front sectional portion 21. The front frame portion 40 of the inner insulating casing 4 and the front of the printed circuit board 30 extend out of the first front sectional portion 11 and the second front sectional portion 21.

Finally, each of the fasteners 5 penetrates through a corresponding one of the second fastening holes 203 of the second outer casing 2 and fastens a corresponding one of the first fastening holes 103 of the first outer casing 1. As such, the cable module 3, the first outer casing 1, and the second outer casing 2 are stably combined.

In use, the guiding protrusion 401 of the inner insulating casing 4 and the guiding protrusion 112 of the first front sectional portion 11 of the first outer casing 1 enable the connector of the present invention to connect to a mating connector easily. Once the cable 31 is pulled, the locking block 311 of the cable 31 prevents the cable 31 from moving, so that the printed circuit board 30 of the cable module 3 will not become loose and its position cannot be altered.

As indicated above, the connector of the present invention has the following advantages:

1. The first outer casing and the second outer casing form a first front sectional portion and a second front sectional portion, respectively, to receive the printed circuit board therein, so that the number of components of the connector of the present invention is reduced, and production costs thereof are reduced.

2. The first projection of the first front sectional portion of the first outer casing and the second projection of the second front sectional portion of the second outer casing are respectively positioned in the first aperture of the first clipping portion and the second aperture of the second clipping portion, so that the inner insulating casing and the printed circuit board are stably retained between the first outer casing and the second outer casing.

3. The locking block is positioned in the first locking recess and the second locking recess, so that the stability of the cable is improved.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An electrical connector comprising:

a first outer casing having a first body portion and a first front sectional portion, and the first front sectional portion extending forwardly from a front end of the first body portion;

a second outer casing having a second body portion and a second front sectional portion, and the second front sectional portion extending forwardly from a front end of the second body portion; and a cable module including a printed circuit board, a cable, and an insulating member, the printed circuit board having a plurality of electric pads disposed at a front thereof, the cable having a front electrically connected to a rear of the printed circuit board, and the insulating member retaining the front of the cable and the rear of the printed circuit board;

wherein the insulating member is received between the first body portion and the second body portion, the printed circuit board is received between the first front sectional portion and the second front sectional portion, and the front of the printed circuit board extends out of the first front sectional portion and the second front sectional portion; and wherein the first front sectional portion of the first outer casing has a guiding protrusion disposed on an outer surface thereof.

2. The electrical connector as claimed in claim 1, wherein the first body portion of the first outer casing has a positioning post disposed on an inner surface thereof, the printed circuit board has a positioning hole, and the positioning post penetrates through the positioning hole.

3. The electrical connector as claimed in claim 1, wherein the first body portion of the first outer casing has a first locking recess disposed in an inner surface thereof, the second body portion of the second outer casing has a second locking recess disposed in an inner surface thereof, the cable has a locking block, and the locking block is positioned in the first locking recess and the second locking recess.

4. The electrical connector as claimed in claim 1, comprising a plurality of fasteners, wherein the first body portion of the first outer casing has a plurality of first fastening holes, the second body portion of the second outer casing has a plurality of second fastening holes, and each of the fasteners penetrates through a corresponding one of the second fastening holes and fastens a corresponding one of the first fastening holes.

5. The electrical connector as claimed in claim 1, comprising an inner insulating casing, wherein the inner insulating casing has a front frame portion, a first clipping portion, and a second clipping portion, a front end of the first clipping portion and a front end of the second clipping portion are connected to the front frame portion, the printed circuit board is fixed between the first clipping portion and the second clipping portion, the front of the printed circuit board is located in the front frame portion, the first clipping portion and the second clipping portion are received between the first front sectional portion of the first outer casing and the second front sectional portion of the second outer casing, and the front frame portion extends out of the first front sectional portion and the second front sectional portion.

6. The electrical connector as claimed in claim 5, wherein the first front sectional portion of the first outer casing has a first insertion tab disposed on a front edge thereof, the second front sectional portion of the second outer casing has a second insertion tab disposed on a front edge thereof, the inner insulating casing has a first insertion hole and a second insertion hole, the first insertion hole is disposed between the first clipping portion and the front frame portion, the second insertion hole is disposed between the second clipping portion and the front frame portion, the first insertion hole and the second insertion hole are asymmetrically arranged, and the first insertion tab and the second insertion tab are respectively positioned in the first insertion hole and the second insertion hole.

7. The electrical connector as claimed in claim 5, wherein the first front sectional portion of the first outer casing has a first projection disposed on an inner surface thereof, the second front sectional portion of the second outer casing has a second projection disposed on an inner surface thereof, the first clipping portion of the inner insulating casing has a first aperture, the second clipping portion of the inner insulating casing has a second aperture, the first aperture and the second aperture are asymmetrically arranged, and the first projection and the second projection are respectively positioned in the first aperture and the second aperture.

8. The electrical connector as claimed in claim 5, wherein the front frame portion of the inner insulating casing has a guiding protrusion.

9. The electrical connector as claimed in claim 5, wherein the printed circuit board of the cable module has a first through hole and a second through hole, the first through hole and the second through hole are asymmetrically arranged, the first clipping portion of the inner insulating casing has a first protruding post disposed on an inner surface thereof, the second clipping portion of the inner insulating casing has a second protruding post disposed on an inner surface thereof, and the first protruding post and the second protruding post are respectively penetrated through the first through hole and the second through hole.

10. An electrical connector comprising:

a first outer casing having a first body portion and a first front sectional portion, and the first front sectional portion extending forwardly from a front end of the first body portion;

a second outer casing having a second body portion and a second front sectional portion, and the second front sectional portion extending forwardly from a front end of the second body portion; and a cable module including a printed circuit board, a cable, and an insulating member, the printed circuit board having a plurality of electric pads disposed at a front thereof, the cable having a front electrically connected to a rear of the printed circuit board, and the insulating member retaining the front of the cable and the rear of the printed circuit board;

wherein the insulating member is received between the first body portion and the second body portion, the printed circuit board is received between the first front sectional portion and the second front sectional portion, and the front of the printed circuit board extends out of the first front sectional portion and the second front sectional portion; and wherein the first body portion of the first outer casing has a positioning post disposed on an inner surface thereof, the printed circuit board has a positioning hole, and the positioning post penetrates through the positioning hole.

11. The electrical connector as claimed in claim 10, wherein the first front sectional portion of the first outer casing has a guiding protrusion disposed on an outer surface thereof.

12. The electrical connector as claimed in claim 10, wherein the first body portion of the first outer casing has a first locking recess disposed in an inner surface thereof, the second body portion of the second outer casing has a second locking recess disposed in an inner surface thereof, the cable has a locking block, and the locking block is positioned in the first locking recess and the second locking recess.

13. The electrical connector as claimed in claim 10, comprising a plurality of fasteners, wherein the first body portion of the first outer casing has a plurality of first fastening holes, the second body portion of the second outer casing has a plurality of second fastening holes, and each of the fasteners penetrates through a corresponding one of the second fastening holes and fastens a corresponding one of the first fastening holes.

14. The electrical connector as claimed in claim 10, comprising an inner insulating casing, wherein the inner insulating casing has a front frame portion, a first clipping portion, and a second clipping portion, a front end of the first clipping portion and a front end of the second clipping portion are connected to the front frame portion, the printed circuit board is fixed between the first clipping portion and the second clipping portion, the front of the printed circuit board is located in the front frame portion, the first clipping portion and the second clipping portion are received between the first front sectional portion of the first outer casing and the second front sectional portion of the second outer casing, and the front frame portion extends out of the first front sectional portion and the second front sectional portion.

15. An electrical connector comprising:

a first outer casing having a first body portion and a first front sectional portion, and the first front sectional portion extending forwardly from a front end of the first body portion;

a second outer casing having a second body portion and a second front sectional portion, and the second front sectional portion extending forwardly from a front end of the second body portion; and a cable module including a printed circuit board, a cable, and an insulating member, the printed circuit board having a plurality of electric pads disposed at a front thereof, the cable having a front electrically connected to a rear of the printed circuit board, and the insulating member retaining the front of the cable and the rear of the printed circuit board;

wherein the insulating member is received between the first body portion and the second body portion, the printed circuit board is received between the first front sectional portion and the second front sectional portion, and the front of the printed circuit board extends out of the first front sectional portion and the second front sectional portion; and wherein the first body portion of the first outer casing has a first locking recess disposed in an inner surface thereof, the second body portion of the second outer casing has a second locking recess disposed in an inner surface thereof, the cable has a locking block, and the locking block is positioned in the first locking recess and the second locking recess.

16. The electrical connector as claimed in claim 15, wherein the first front sectional portion of the first outer casing has a guiding protrusion disposed on an outer surface thereof.

17. The electrical connector as claimed in claim 15, wherein the first body portion of the first outer casing has a positioning post disposed on an inner surface thereof, the printed circuit board has a positioning hole, and the positioning post penetrates through the positioning hole.

18. The electrical connector as claimed in claim 15, comprising a plurality of fasteners, wherein the first body portion of the first outer casing has a plurality of first fastening holes, the second body portion of the second outer casing has a plurality of second fastening holes, and each of the fasteners penetrates through a corresponding one of the second fastening holes and fastens a corresponding one of the first fastening holes.

19. The electrical connector as claimed in claim 15, comprising an inner insulating casing, wherein the inner insulating casing has a front frame portion, a first clipping portion, and a second clipping portion, a front end of the first clipping portion and a front end of the second clipping portion are connected to the front frame portion, the printed circuit board is fixed between the first clipping portion and the second clipping portion, the front of the printed circuit board is located in the front frame portion, the first clipping portion and the second clipping portion are received between the first front sectional portion of the first outer casing and the second front sectional portion of the second outer casing, and the front frame portion extends out of the first front sectional portion and the second front sectional portion.

* * * * *